(12) United States Patent
Kamijima

(10) Patent No.: US 6,936,180 B2
(45) Date of Patent: Aug. 30, 2005

(54) THIN-FILM PATTERNING METHOD, MANUFACTURING METHOD OF THIN-FILM DEVICE AND MANUFACTURING METHOD OF THIN-FILM MAGNETIC HEAD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 501 days.

(21) Appl. No.: 09/772,858

(22) Filed: Jan. 31, 2001

(65) Prior Publication Data

US 2001/0027029 A1 Oct. 4, 2001

(30) Foreign Application Priority Data

Feb. 10, 2000 (JP) ........................................ 2000-033440

(51) Int. Cl.[7] .......................... H01L 21/425; G03F 7/20
(52) U.S. Cl. .............................. 216/22; 216/47; 216/48; 216/66; 204/192.34; 250/396; 250/492.21
(58) Field of Search .............................. 216/12, 13, 22, 216/39, 40, 47, 48, 49, 51, 52, 66, 75; 204/192.34; 250/396, 492.21; 438/712

(56) References Cited

U.S. PATENT DOCUMENTS

| | | | | |
|---|---|---|---|---|
| 4,377,437 A | * | 3/1983 | Taylor et al. ................. | 216/62 |
| 4,592,801 A | * | 6/1986 | Hara et al. ..................... | 216/22 |
| 5,316,617 A | * | 5/1994 | Kawabe et al. ................ | 216/22 |
| 5,506,197 A | * | 4/1996 | Nakamura et al. ........... | 505/193 |
| 6,055,220 A | * | 4/2000 | Mamin et al. ............ | 369/13.13 |
| 6,304,784 B1 | * | 10/2001 | Allee et al. .................. | 607/116 |
| 6,641,705 B2 | * | 11/2003 | Phaneuf et al. ......... | 204/192.34 |

FOREIGN PATENT DOCUMENTS

| | | | | |
|---|---|---|---|---|
| JP | 01175232 A | * | 7/1989 | ......... H01L/21/302 |
| JP | 04251853 A | * | 9/1992 | ............ G03F/7/075 |
| WO | WO 200153891 A1 | * | 7/2001 | .............. B81B/7/00 |

OTHER PUBLICATIONS

Morimoto et al., "A GaAs Metal–Semiconductor Field–Effect Transistor With a Mushroom Gate Fabricated by Mixed Exposure of Focussed Ion Beams"□□J. Vac. Sci. Technology, B, vol. 5 No. 1 Jan./Feb. 1987, pp. 211–214.□□.*

* cited by examiner

Primary Examiner—Allan Olsen
(74) Attorney, Agent, or Firm—Burns, Doane, Swecker & Mathis, LLP

(57) ABSTRACT

At least one strippable film on a surface of a thin film to be patterned is formed, then the at least one strippable film and the thin film to be patterned is patterned by using FIB, and thereafter the at least one strippable film is removed.

27 Claims, 6 Drawing Sheets

THIN-FILM PATTERNING METHOD, MANUFACTURING METHOD OF THIN-FILM DEVICE AND MANUFACTURING METHOD OF THIN-FILM MAGNETIC HEAD

FIELD OF THE INVENTION

The present invention relates to a method of patterning a thin film by using focused ion beam (FIB), to a method of manufacturing a thin-film device, and to a method of manufacturing a thin-film magnetic head.

DESCRIPTION OF THE RELATED ART

FIGS. 1a to 1c illustrate processes of a conventional method of directly patterning a thin film by using FIB.

First, on a substrate 10 shown in FIG. 1a, a thin film 11 to be patterned is deposited by for example sputtering as shown in FIG. 1b. Then, as shown in FIG. 1c, unnecessary portions of the thin film 11 are removed by directly radiating FIB to the film 11 and thus a patterned thin film 11' is obtained.

This method using FIB has allowed patterning without using a mask, and may pave the way for a minute patterning. However, the conventional patterning method using FIB has the following problems.

Since the FIB directly radiated to a thin film to be patterned is not a beam completely focused to its center but is a beam spreading in the Gaussian distribution, upper parts of the thin film such as upper edges of each pattern are needlessly etched to some extent. Thus, it is difficult to improve the patterning precision.

Since according to the conventional patterning method using FIB, a beam of ions such as charged Ga is directly radiated to a thin film to be patterned, the radiated thin film will be charged by the ions and therefore may be broken by the electrostatic discharge.

SUMMARY OF THE INVENTION

It is therefore an object of the present invention to provide a thin-film patterning method, a method of manufacturing a thin-film device and a method of manufacturing a thin-film magnetic head, whereby a patterning resolution or a patterning precision can be more improved.

Another object of the present invention is to provide a thin-film patterning method, a method of manufacturing a thin-film device and a method of manufacturing a thin-film magnetic head, whereby a thin film to be patterned can be prevented from being damaged due to electric charge applied by FIB.

According to the present invention, a thin film patterning method includes a step of forming at least one strippable film on a surface of a thin film to be patterned, a step of patterning the at least one strippable film and the thin film to be patterned by using FIB, and a step of removing the at least one strippable film. In a method of manufacturing a thin-film device and in a method of manufacturing a thin-film magnetic head, at least a part of a thin-film pattern is fabricated by using this thin-film patterning method.

The FIB etching is performed after forming the strippable film on the thin film to be patterned. Thus, even if the FIB is not completely focused but spread, only upper edges of the pattern of the strippable film which is removed after the patterning are etched but upper edges of the thin film to be patterned are not needlessly etched. As a result, it is possible to greatly increase resolution of patterning and to extremely improve the patterning precision.

According to the present invention, also, a method of patterning a thin film includes a step of forming at least one strippable film, a step of patterning the at least one strippable film by using FIB, a step of forming a thin film to be patterned by using the patterned at least one strippable film, and a step of removing the patterned at least one strippable film. In a method of manufacturing a thin-film device and in a method of manufacturing a thin-film magnetic head, at least a part of a thin-film pattern is fabricated by using this thin-film patterning method.

Since the mask pattern used in a lift off process is etched by using FIB, the lower limitation of patterning, which is about 0.2 μm in width according to the conventional optical patterning method, can be further improved. In addition, since the FIB etching is performed through the strippable film, even if the FIB is not completely focused but spread, only upper edges of the pattern of the strippable film which is removed after the patterning are etched but lower edges of the strippable film, which are important as the mask pattern, are not needlessly etched. As a result, it is possible to greatly increase resolution of patterning and to extremely improve the patterning precision.

According to the present invention, further, a method of patterning a thin film includes a step of forming at least one strippable film on a surface of a first thin film to be patterned, a step of patterning the at least one strippable film and the first thin film to be patterned by using FIB, a step of forming a second thin film to be patterned using the patterned at least one strippable film and the patterned first thin film to be patterned as a mask, and a step of removing the patterned at least one strippable film. In a method of manufacturing a thin-film device and in a method of manufacturing a thin-film magnetic head, at least a part of a thin-film pattern is fabricated by using this thin-film patterning method.

Since the first thin film etched by using FIB is used as the mask pattern in a lift off process, the lower limitation of patterning, which is about 0.2 μm in width according to the conventional optical patterning method, can be further improved. In addition, since the FIB etching is performed after forming the strippable film on the first thin film to be patterned, even if the FIB is not completely focused but spread, only upper edges of the pattern of the strippable film which is removed after the patterning are etched but upper edges of the first thin film are not needlessly etched. Therefore, it is possible not only to greatly improve the patterning precision of the first thin film but also to greatly increase resolution of mask patterning because lower edges of the strippable film, which are important as the mask pattern for forming the second thin film, are not needlessly etched. As a result, the patterning precision of the first and second thin films and can be greatly improved.

It is preferred that the at least one strippable film is an insulating organic film or a conductive organic film.

It is also preferred that the at least one strippable film has a two-layers structure of an insulating organic film and a conductive film such as a metallic material film or a conductive organic film, formed on the insulating organic film. Thus, electric charge due to the FIB will escape to the conductive film. Therefore, the thin film to be patterned will never be charged resulting that a breakdown of the thin film due to electrostatic discharge can be effectively prevented.

Preferably, the conductive film is a grounded film. If the conductive film is grounded, more reliable prevention of the breakdown due to electrostatic discharge can be expected.

Further objects and advantages of the present invention will be apparent from the following description of the preferred embodiments of the invention as illustrated in the accompanying drawings.

DESCRIPTION OF THE PREFERRED EMBODIMENTS

FIGS. 2a to 2f illustrate processes of a thin-film patterning in a preferred embodiment according to the present invention. In this embodiment, a thin film to be patterned is directly patterned by using FIB. The thin film to be patterned may be any film applicable in a thin-film device. In a thin-film magnetic head, the thin film to be patterned may be a thin film of a magnetic pole, or a thin film or a multi-layered film of a magnetoresistive effect (MR) element for example.

Figure 1A:
FIGS. 1a to 1c, already described, show sectional views illustrating processes of a conventional method of directly patterning a thin film by using FIB.
Figure 1B:
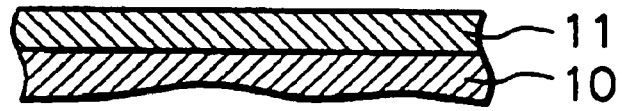
Figure 1C:
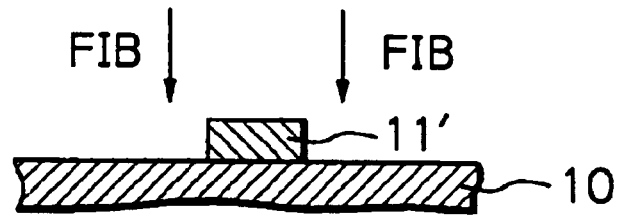
Figure 2A:
FIGS. 2a to 2f show sectional views illustrating processes of a thin-film patterning in a preferred embodiment according to the present invention.
Figure 2B:

As shown in FIG. 2a, first, a substrate or an under layer 20 on which a thin film to be patterned will be formed is prepared. On this substrate or under layer 20, the thin film to be patterned 21 is deposited by sputtering for example as shown in FIG. 2b.

Figure 2C:
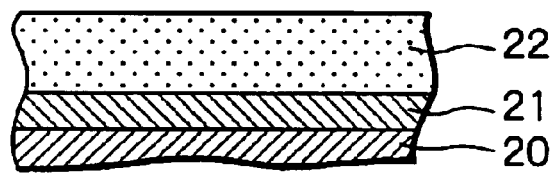
Figure 2D:
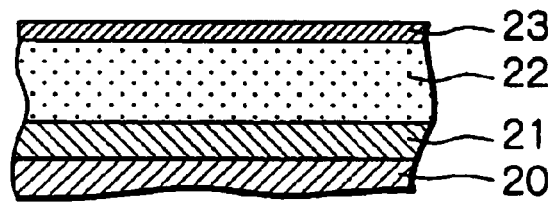

Then, as shown in FIG. 2c, an insulating organic film 22 as a strippable film is coated on the thin film 21, and, as shown in FIG. 2d, a conductive film 23 is formed on the film 22 by sputtering or coating.

Figure 2E:
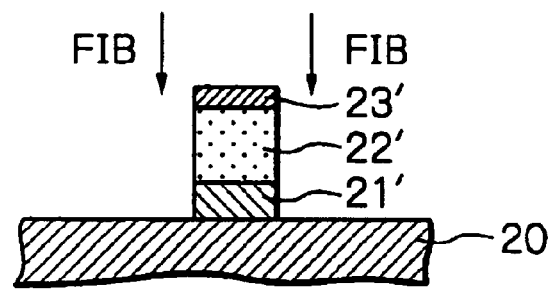

Thereafter, as shown in FIG. 2e, unnecessary portions are etched and removed by using FIB, so that a patterned conductive film 23', a patterned insulating organic film 22' and a patterned thin film 21' are obtained.

Figure 2F:
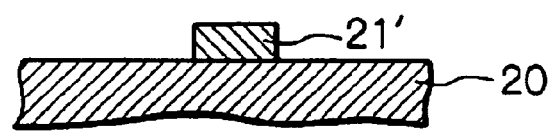

Then, the patterned insulating organic film 22' is melted by an organic solvent to remove this melted film 22' and also the patterned conductive film 23' on the film 22'. As a result, as shown in FIG. 2f, only the patterned thin film 21' is remained.

The strippable film is not limited to the aforementioned insulating organic film. Any film is applicable as the strippable film if it can be formed as a thin film by coating for example and melted by an organic solvent. For example, a conductive organic film which will be mentioned later is applicable.

As for the insulating organic film 22, an organic resin film material such as resist film material may be used. More specifically, the resist film material may be negative resist materials such as polyglycidyl methacrylate, polymer of glycidyl methacrylate and ethyl acrylate, chloromethylation polystyrene, polyvinylphenol and azide compound, and novolak resin with cross linking agent and acid generating agent, or positive resist materials such as polymethyl methacrylate, poly(butene-1-sulfone), novolak resin with solubilizing inhibitor of for example PMPS (poly(2-methylpentene-1-sulfone), poly(2,2,2-trifluoroethyl-2-chloroacrylate), copolymer of α-methyl styrene and α-chloro acrylic acid, and novolak resin with quinonediazide.

As for the conductive film 23, any kind of metallic film material may be used. Instead of the metallic film material, carbon film material or conductive organic film material may be used. More specifically, the conductive organic film material may be poly(isothianaphthenedil sulfonate), TCNQ chain polymer, poly(3-thienylalkanesulfonic acid compound), or ammoniate of polyaniline sulfonate.

According to this embodiment, the FIB etching is performed after depositing two layers of the insulating organic film 22 that is the strippable film and the conductive film 23 on the thin film to be patterned 21. Thus, even if the FIB is not completely focused but spread, only upper edges of the pattern of the insulating organic layer 22 which is removed after the patterning are etched but upper edges of the thin film to be patterned 21 are not needlessly etched. As a result, it is possible to greatly increase resolution of patterning and to extremely improve the patterning precision.

In addition, according to the embodiment, since the conductive film 23 with a larger area is formed on the insulating organic film 23, electric charge due to the FIB will escape to the conductive film 23. Therefore, the thin film to be patterned 21 will never be charged resulting that a breakdown of the thin film 21 due to electrostatic discharge can be effectively prevented. If the conductive film 23 is grounded, more reliable prevention of the breakdown due to electrostatic discharge can be expected.

In the aforementioned embodiment of FIGS. 2a to 2f, the two layers of the insulating organic film 22 and the conductive film 23 are deposited on the thin film to be patterned 21 and then the patterning using FIB is performed. However, in modification, an additional film may be deposited on the two layer and then the patterning using FIB will be performed. Furthermore, in another modification, only a single strippable film such as an insulating organic film or a conductive film may be deposited on a thin film to be patterned and then the patterning using FIB will be performed. In the former case depositing only the insulating organic film, no prevention of the breakdown due to electrostatic discharge can be obtained.

FIGS. 3a to 3f illustrate processes of a thin-film patterning in another embodiment according to the present invention. In this embodiment, a mask used in a lift-off method is patterned by using FIB. A thin film to be patterned may be any film applicable in a thin-film device. In a thin-film magnetic head, the thin film to be patterned may be a thin film of a longitudinal bias film or lead conductor films of a MR element for example.

Figure 3A:
FIGS. 3a to 3f show sectional views illustrating processes of a thin-film patterning in another embodiment according to the present invention.
Figure 3B:
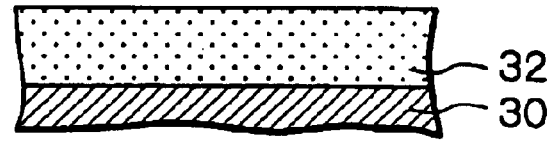
Figure 3C:
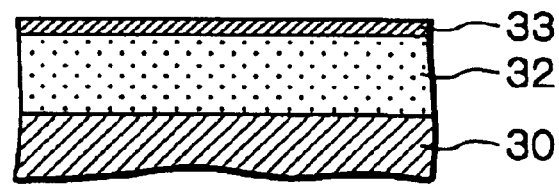

As shown in FIG. 3a, first, a substrate or an under layer 30 on which a thin film to be patterned will be formed is prepared. On this substrate or under layer 30, an insulating organic film 32 as a strippable film is coated as shown in FIG. 3b, and then, as shown in FIG. 3c a conductive film 33 is formed on the film 32 by sputtering or coating.

Figure 3D:
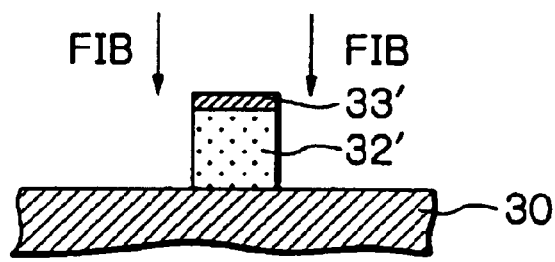

Thereafter, as shown in FIG. 3d, unnecessary portions are etched and removed by using FIB, so that a patterned conductive film 33' and a patterned insulating organic film 32' are obtained.

Figure 3E:
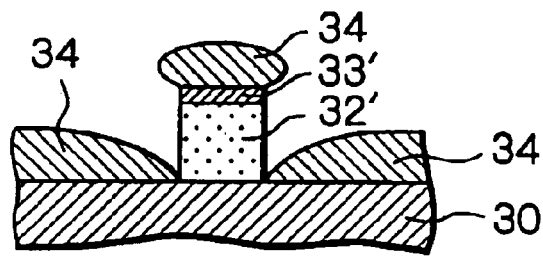

Then, as shown in FIG. 3e, the thin film to be patterned 34 is deposited by sputtering for example, using the patterned conductive film 33' and the patterned insulating organic film 32' as a mask pattern.

Figure 3F:
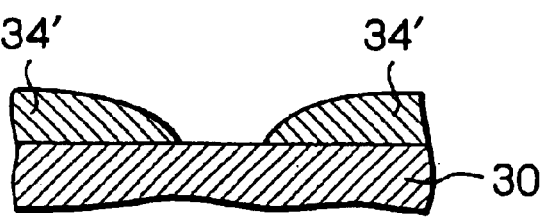

Then, as well as done in the general lift-off method, the mask pattern is removed by an organic solvent. Namely, the patterned insulating organic film 32' is melted by the organic solvent to remove this melted film 32' and also the patterned conductive film 33'. As a result, as shown in FIG. 3f, only a patterned thin film 34' is remained.

The strippable film is not limited to the aforementioned insulating organic film. Any film is applicable as the strippable film if it can be formed as a thin film by coating for example and melted by an organic solvent. For example, a conductive organic film which will be mentioned later is applicable.

As for the insulating organic film 32, an organic resin film material such as resist film material may be used. More specifically, the resist film material may be negative resist materials such as polyglycidyl methacrylate, polymer of glycidyl methacrylate and ethyl acrylate, chloromethylation polystyrene, polyvinylphenol and azide compound, and novolak resin with cross linking agent and acid generating agent, or positive resist materials such as polymethyl methacrylate, poly(butene-1-sulfone), novolak resin with solubilizing inhibitor of for example PMPS (poly(2-methylpentene-1-sulfone), poly(2,2,2-trifluoroethyl-2-chloroacrylate), copolymer of α-methyl styrene and α-chloro acrylic acid, and novolak resin with quinonediazide.

As for the conductive film 33, any kind of metallic film material may be used. Instead of the metallic film material, carbon film material or conductive organic film material may be used. More specifically, the conductive organic film material may be poly(isothianaphthenedil sulfonate), TCNQ chain polymer, poly(3-thienylalkanesulfonic acid compound), or ammoniate of polyaniline sulfonate.

According to this embodiment, the FIB etching is performed after depositing two layers of the insulating organic film 32 that is the strippable film and the conductive film 33 on the substrate 30. Thus, even if the FIB is not completely focused but spread, only upper edges of the pattern of the insulating organic layer 32 which is removed after the patterning are etched but lower edges of the insulating organic film 32, which are important as the mask pattern, are not needlessly etched. As a result, it is; possible to greatly increase resolution of patterning and to extremely improve the patterning precision.

In addition, according to the embodiment, since the conductive film 33 with a larger area is formed on the insulating organic film 33, electric charge due to the FIB will escape to the conductive film 33. Therefore, the substrate 30 will never be charged resulting that a breakdown of other films on the substrate 30 due to electrostatic discharge can be effectively prevented. If the conductive film 33 is grounded, more reliable prevention of the breakdown due to electrostatic discharge can be expected.

In the aforementioned embodiment of FIGS. 3a to 3f, the two layers of the insulating organic film 32 and the conductive film 33 are deposited on the substrate 30 and then the patterning using FIB is performed. However, in modification, an additional film may be deposited on the two layer and then the patterning using FIB will be performed. Furthermore, in another modification, only a single strippable film such as an insulating organic film or a conductive film may be deposited on the substrate and then the patterning using FIB will be performed. In the former case depositing only the insulating organic film, no prevention of the breakdown due to electrostatic discharge can be obtained.

FIGS. 4a to 4g illustrate processes of a thin-film patterning in a further embodiment according to the present invention. In this embodiment, a mask used in a lift-off method is patterned by using FIB. A thin film to be patterned may be any film applicable in a thin-film device. In a thin-film magnetic head, the thin film to be patterned may be a thin film of a longitudinal bias film or lead conductor films of a MR element for example.

Figure 4A:
FIGS. 4a to 4g show sectional views illustrating processes of a thin-film patterning in a further embodiment according to the present invention.
Figure 4B:
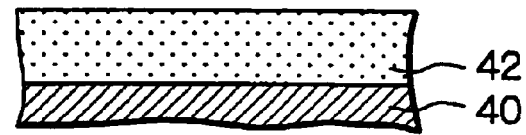
Figure 4C:
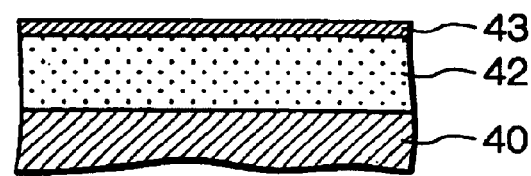

As shown in FIG. 4a, first, a substrate or an under layer 40 on which a thin film to be patterned will be formed is prepared. On this substrate or under layer 40, an insulating organic film 42 as a strippable film is coated as shown in FIG. 4b, and then, as shown in FIG. 4c a conductive film 43 is formed on the film 42 by sputtering or coating.

Figure 4D:
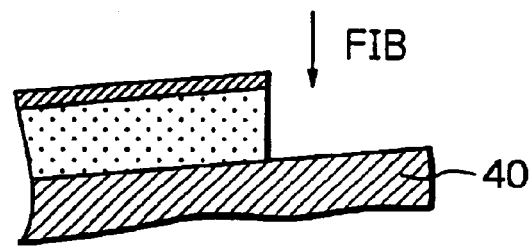
Figure 4E:
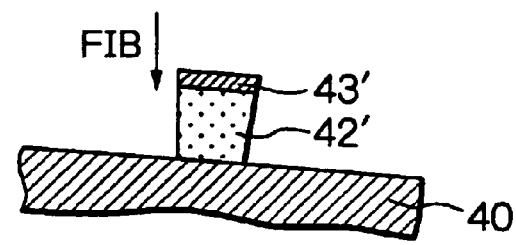

Thereafter, as shown in FIGS. 4d and 4e, unnecessary portions are etched and removed by using FIB. Especially, in this embodiment, during the FIB etching, the substrate 40 is inclined with respect to the beam so that a section of a patterned conductive film 43' and a patterned insulating organic film 42' has a reversed taper shape or a reversed trapezoidal shape.

Figure 4F:
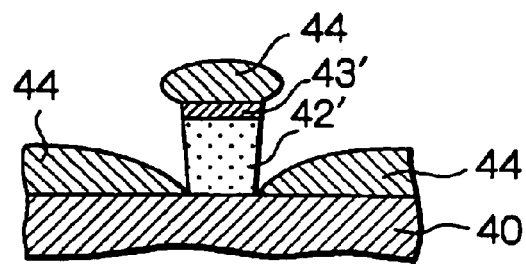

Then, as shown in FIG. 4f, a thin film to be patterned 44 is deposited by sputtering for example by using the patterned conductive film 43' and the patterned insulating organic film 42' as a mask pattern.

Figure 4G:
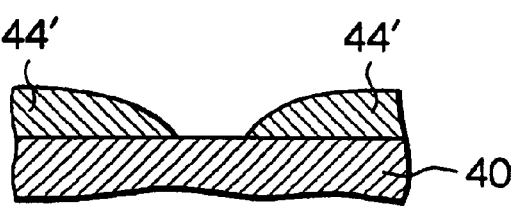

Then, as well as done in the general lift-off method, the mask pattern is removed by an organic solvent. Namely, the patterned insulating organic film 42' is melted by the organic solvent to remove this melted film 42' and also the patterned conductive film 43'. As a result, as shown in FIG. 4g, only a patterned thin film 44' is remained.

Applicable material for the films, advantages and modifications in this embodiment are the same as those in the embodiment of FIGS. 3a to 3f.

FIGS. 5a to 5g illustrate processes of a thin-film patterning in a still further embodiment according to the present invention. In this embodiment, a method for directly patterning a thin film to be patterned by using FIB is used in conjunction with a lift off method. The thin film to be patterned may be any film applicable in a thin-film device. In a thin-film magnetic head, the thin film to be patterned may be a thin film of a longitudinal bias film or lead conductor films of a MR element for example.

Figure 5A:
FIGS. 5a to 5g show sectional views illustrating processes of a thin-film patterning in a still further embodiment according to the present invention.
Figure 5B:
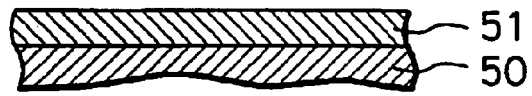

As shown in FIG. 5a, first, a substrate or an under layer 50 on which a thin film to be patterned will be formed is prepared. On this substrate or under layer 50, a first thin film to be patterned 51 is deposited by sputtering for example as shown in FIG. 5b.

Figure 5C:
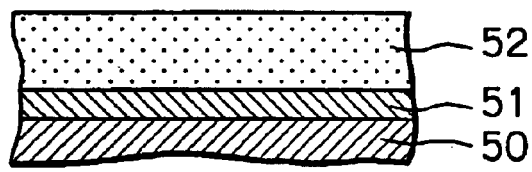
Figure 5D:
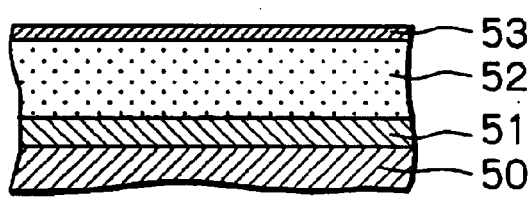

Then, as shown in FIG. 5c, an insulating organic film 52 as a strippable film is coated on the first thin film 51, and then, as shown in FIG. 5d a conductive film 53 is formed on the film 52 by sputtering or coating.

Figure 5E:
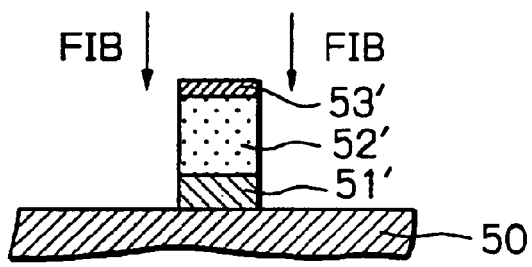

Thereafter, as shown in FIG. 5e, unnecessary portions are etched and removed by using FIB, so that a patterned conductive film 53', a patterned insulating organic film 52', and a patterned first thin film 51' are obtained.

Figure 5F:
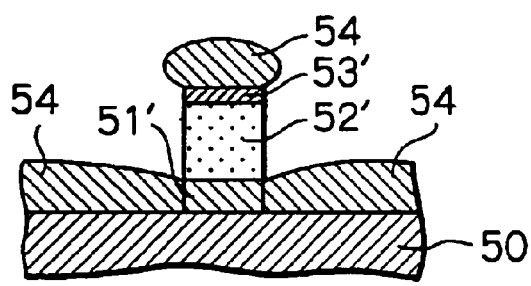

Then, as shown in FIG. 5f, a second thin film to be patterned 54 is deposited by sputtering for example by using the patterned conductive film 53', the patterned insulating organic film 52' and the patterned first thin film 51' as a mask pattern.

Figure 5G:
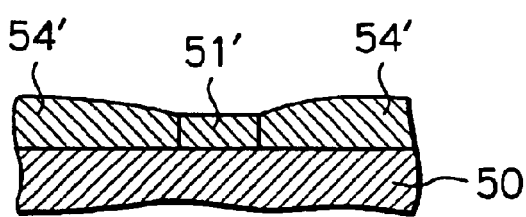

Then, as well as done in the general lift-off method, the mask pattern is removed by an organic solvent. Namely, the patterned insulating organic film 52' is melted by the organic solvent to remove this melted film 52' and also the patterned conductive film 53'. As a result, as shown in FIG. 5g, only the patterned first thin film 51' and a patterned thin film 54' is remained.

The strippable film is not limited to the aforementioned insulating organic film. Any film is applicable as the strippable film if it can be formed as a thin film by coating for example and melted by an organic solvent. For example, a conductive organic film which will be mentioned later is applicable.

As for the insulating organic film 52, an organic resin film material such as resist film material may be used. More specifically, the resist film material may be negative resist materials such as polyglycidyl methacrylate, polymer of glycidyl methacrylate and ethyl acrylate, chloromethylation polystyrene, polyvinylphenol and azide compound, and novolak resin with cross linking agent and acid generating agent, or positive resist materials such as polymethyl methacrylate, poly(butene-1-sulfone), novolak resin with solubilizing inhibitor of for example PMPS (poly(2-methylpentene-1-sulfone), poly(2,2,2-trifluoroethyl-2-chloroacrylate), copolymer of α-methyl styrene and α-chloro acrylic acid, and novolak resin with quinonediazide.

As for the conductive film 53, any kind of metallic film material may be used. Instead of the metallic film material, carbon film material or conductive organic film material may be used. More specifically, the conductive organic film material may be poly(isothianaphthenedil sulfonate), TCNQ chain polymer, poly(3-thienylalkanesulfonic acid compound), or ammoniate of polyaniline sulfonate.

According to this embodiment, the FIB etching is performed after depositing two layers of the insulating organic film 52 that is the strippable film and the conductive film 53 on the first thin film to be patterned 51. Thus, even if the FIB is not completely focused but spread, only upper edges of the pattern of the insulating organic layer 52 which is removed after the patterning are etched but upper edges of the first thin film to be patterned 51 are not needlessly etched. Therefore, it is possible not only to greatly improve the patterning precision of the first thin film 51 but also to greatly increase resolution of mask patterning because lower edges of the insulating organic film 52, which are important as the mask pattern, are not needlessly etched. As a result, the patterning precision of the first and second thin films 51 and 54 can be greatly improved.

In addition, according to the embodiment, since the conductive film 53 with a larger area is formed on the insulating organic film 53, electric charge due to the FIB will escape to the conductive film 53. Therefore, the first thin film to be patterned 51 will never be charged resulting that a breakdown of the first thin film 51 due to electrostatic discharge can be effectively prevented. If the conductive film 53 is grounded, more reliable prevention of the breakdown due to electrostatic discharge can be expected.

In the aforementioned embodiment of FIGS. 5a to 5g, the two layers of the insulating organic film 52 and the conductive film 53 are deposited on the first thin film to be patterned 51 and then the patterning using FIB is performed. However, in modification, an additional film may be deposited on the two layer and then the patterning using FIB will be performed. Furthermore, in another modification, only a single strippable film such as an insulating organic film or a conductive film may be deposited on a first thin film to be patterned and then the patterning using FIB will be performed. In the former case depositing only the insulating organic film, no prevention of the breakdown due to electrostatic discharge can be obtained.

FIGS. 6a to 6h illustrate processes of a thin-film patterning in a further embodiment according to the present invention. In this embodiment, a method for directly patterning a thin film to be patterned by using FIB is used in conjunction with a lift off method. The thin film to be patterned may be any film applicable in a thin-film device. In a thin-film magnetic head, the thin film to be patterned may be a thin film of a longitudinal bias film or lead conductor films of a MR element for example.

Figure 6A:
FIGS. 6a to 6h show sectional views illustrating processes of a thin-film patterning in a further embodiment according to the present invention.
Figure 6B:

As shown in FIG. 6a, first, a substrate or an under layer 60 on which a thin film to be patterned will be formed is prepared. On this substrate or under layer 60, a first thin film to be patterned 61 is deposited by sputtering for example as shown in FIG. 6b.

Figure 6C:
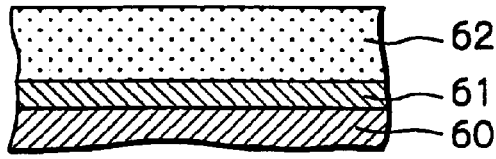
Figure 6D:
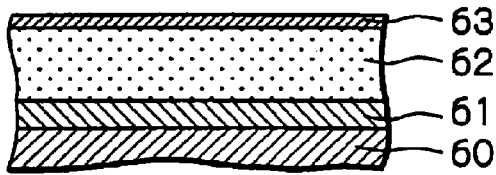

Then, as shown in FIG. 6c, an insulating organic film 62 as a strippable film is coated on the first thin film 61, and then, as shown in FIG. 6d a conductive film 63 is formed on the film 62 by sputtering or coating.

Figure 6E:
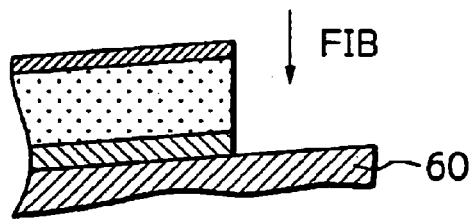
Figure 6F:
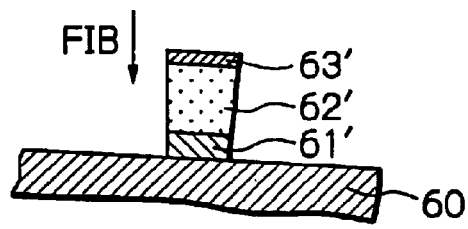

Thereafter, as shown in FIGS. 6e and 6f, unnecessary portions are etched and removed by using FIB. Especially, in this embodiment, during the FIB etching, the substrate 60 is inclined with respect to the beam so that a section of a patterned conductive film 63', a patterned insulating organic film 62' and a patterned first thin film 61' has a reversed taper shape or a reversed trapezoidal shape.

Figure 6G:
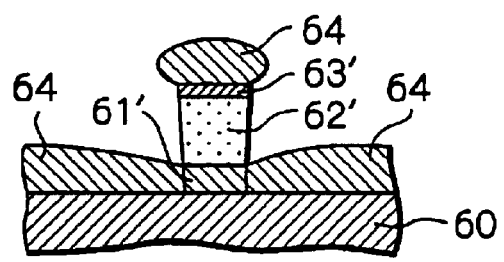

Then, as shown in FIG. 6g, a second thin film to be patterned 64 is deposited by sputtering for example by using the patterned conductive film 63', the patterned insulating organic film 62' and the patterned first thin film 61' as a mask pattern.

Figure 6H:
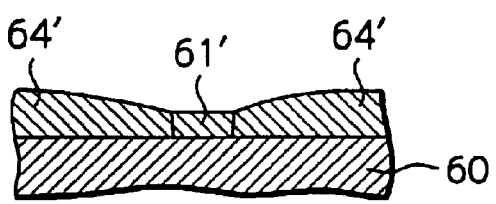

Then, as well as done in the general lift-off method, the mask pattern is removed by an organic solvent. Namely, the patterned insulating organic film 62' is melted by the organic solvent to remove this melted film 52' and also the patterned conductive film 63'. As a result, as shown in FIG. 6h, only the patterned first thin film 61' and a patterned thin film 64' is remained.

Applicable material for the films, advantages and modifications in this embodiment are the same as those in the embodiment of FIGS. 5a to 5g.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of patterning a thin film comprising the steps of:
    forming at least one strippable film on a surface of a thin film to be patterned;
    directly patterning said at least one strippable film together with said thin film to be patterned by using focused ion beam etching; and
    removing the etched at least one strippable film.

2. The method as claimed in claim 1, wherein said at least one strippable film is an insulating organic film.

3. The method as claimed in claim 1, wherein said at least one strippable film is a conductive organic film.

4. The method as claimed in claim 1, wherein said at least one strippable film is an insulating organic film and a conductive film formed on said insulating organic film.

5. The method as claimed in claim 4, wherein said conductive film is a grounded film.

6. The method as claimed in claim 4, wherein said conductive film is a metallic material film.

7. The method as claimed in claim 4, wherein said conductive film is a conductive organic film.

8. A method of manufacturing a thin-film device, at least a part of a thin-film pattern being fabricated by using a thin-film patterning method, said thin film patterning method comprising the steps of:
- forming at least one strippable film on a surface of a thin film to be patterned;
- directly patterning said at least one strippable film together with said thin film to be patterned by using focused ion beam etching; and
- removing the etched at least one strippable film.

9. A method of manufacturing a thin-film magnetic head, at least a part of a thin-film pattern being fabricated by using a thin-film patterning method, said thin film patterning method comprising the steps of:
- forming at least one strippable film on a surface of a thin film to be patterned;
- directly patterning said at least one strippable film together with said thin film to be patterned by using focused ion beam etching; and
- removing the etched at least one strippable film.

10. A method of patterning a thin film comprising the steps of:
- forming at least one strippable film;
- directly patterning said at least one strippable film by using focused ion beam etching;
- depositing a thin film to be patterned by using the etched at least one strippable film; and
- removing the etched at least one strippable film.

11. The method as claimed in claim 10, wherein said at least one strippable film is an insulating organic film.

12. The method as claimed in claim 10, wherein said at least one strippable film is a conductive organic film.

13. The method as claimed in claim 10, wherein said at least one strippable film is formed as two layers including an insulating organic film and a conductive film formed on said insulating organic film.

14. The method as claimed in claim 13, wherein said conductive film is a grounded film.

15. The method as claimed in claim 13, wherein said conductive film is a metallic material film.

16. The method as claimed in claim 13, wherein said conductive film is a conductive organic film.

17. A method of manufacturing a thin-film device, at least a part of a thin-film pattern being fabricated by using a thin-film patterning method, said thin film patterning method comprising the steps of:
- forming at least one strippable film;
- directly patterning said at least one strippable film by using focused ion beam etching;
- depositing a thin film to be patterned by using the etched at least one strippable film; and
- removing the etched at least one strippable film.

18. A method of manufacturing a thin-film magnetic head, at least a part of a thin-film pattern being fabricated by using a thin-film patterning method, said thin film patterning method comprising the steps of:
- forming at least one strippable film;
- directly patterning said at least one strippable film by using focused ion beam etching;
- depositing a thin film to be patterned by using the etched at least one strippable film; and
- removing the etched at least one strippable film.

19. A method of patterning a thin film comprising the steps of:
- forming at least one strippable film on a surface of a first thin film to be patterned;
- directly patterning said at least one strippable film together with said first thin film to be patterned by using focused ion beam etching;
- depositing a second thin film to be patterned by using the etched at least one strippable film and said patterned first thin film to be patterned as a mask; and
- removing the etched at least one strippable film.

20. The method as claimed in claim 19, wherein said at least one strippable film is an insulating organic film.

21. The method as claimed in claim 19, wherein said at least one strippable film is a conductive organic film.

22. The method as claimed in claim 19, wherein said at least one strippable film is formed as two layers including an insulating organic film and a conductive film formed on said insulating organic film.

23. The method as claimed in claim 22, wherein said conductive film is a grounded film.

24. The method as claimed in claim 22, wherein said conductive film is a metallic material film.

25. The method as claimed in claim 22, wherein said conductive film is a conductive organic film.

26. A method of manufacturing a thin-film device, at least a part of a thin-film pattern being fabricated by using a thin-film patterning method, said thin film patterning method comprising the steps of:
- forming at least one strippable film on a surface of a first thin film to be patterned;
- directly patterning said at least one strippable film together with said first thin film to be patterned by using focused ion beam etching;
- depositing a second thin film to be patterned by using the etched at least one strippable film and the etched first thin film to be patterned as a mask; and
- removing the etched at least one strippable film.

27. A method of manufacturing a thin-film magnetic head, at least a part of a thin-film pattern being fabricated by using a thin-film patterning method, said thin film patterning method comprising the steps of:
- forming at least one strippable film on a whole surface of a first thin film to be patterned;
- directly patterning said at least one strippable film together with said first thin film to be patterned by using focused ion beam etching;
- depositing a second thin film to be patterned by using the etched at least one strippable film and the etched first thin film to be patterned as a mask; and
- removing the etched at least one strippable film.

* * * * *